US011460774B2

(12) United States Patent
Hirano et al.

(10) Patent No.: US 11,460,774 B2
(45) Date of Patent: Oct. 4, 2022

(54) PHOTOSENSITIVE RESIN COMPOSITION, PHOTOSENSITIVE DRY FILM, AND PATTERN FORMING PROCESS

(71) Applicant: Shin-Etsu Chemical Co., Ltd., Tokyo (JP)

(72) Inventors: Yoshinori Hirano, Annaka (JP); Michihiro Sugo, Annaka (JP); Satoshi Asai, Annaka (JP); Takahiro Goi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 48 days.

(21) Appl. No.: 16/716,821

(22) Filed: Dec. 17, 2019

(65) Prior Publication Data

US 2020/0201182 A1 Jun. 25, 2020

(30) Foreign Application Priority Data

Dec. 19, 2018 (JP) .............................. JP2018-237135

(51) Int. Cl.
| | | |
|---|---|---|
| *G03F 7/075* | (2006.01) | |
| *C08F 236/02* | (2006.01) | |
| *C09D 147/00* | (2006.01) | |
| *G03F 7/004* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0757* (2013.01); *C08F 236/02* (2013.01); *C09D 147/00* (2013.01); *G03F 7/0045* (2013.01); *G03F 7/162* (2013.01); *G03F 7/168* (2013.01); *G03F 7/2004* (2013.01); *G03F 7/325* (2013.01); *G03F 7/38* (2013.01)

(58) Field of Classification Search
CPC ...... G03F 7/0757; G03F 7/0045; G03F 7/162; G03F 7/168; G03F 7/2004; G03F 7/325; G03F 7/38; G03F 7/038; G03F 7/20; G03F 7/0382; G03F 7/004; G03F 7/40; G03F 7/405; G03F 7/0392; C08F 236/02; C09D 147/00; C09D 183/14; C09D 183/16; C08G 77/52; C08G 77/48; C08G 77/14; C08G 59/3281; C08G 77/60; C08G 59/621; C08L 83/14; C08L 63/00; C08L 83/10; C08K 5/3492; C08K 5/13; C08K 5/0025; C23C 18/1605; C25D 5/022

See application file for complete search history.

(56) References Cited

U.S. PATENT DOCUMENTS

| | | |
|---|---|---|
| 4,470,831 A | 9/1984 | Hirose |
| 4,990,546 A | 2/1991 | Eckberg |
| 5,240,971 A | 8/1993 | Eckberg et al. |
| 5,346,980 A | 9/1994 | Babu |
| 5,750,589 A | 5/1998 | Zech et al. |
| 6,072,016 A | 6/2000 | Kobayashi et al. |
| 6,590,010 B2 | 7/2003 | Kato et al. |
| 7,785,766 B2 | 8/2010 | Maruyama et al. |
| 8,697,333 B2 | 4/2014 | Soga et al. |
| 8,715,905 B2 | 5/2014 | Tagami et al. |
| 8,729,148 B2 | 5/2014 | Asai et al. |
| 8,796,410 B2 | 8/2014 | Sugo et al. |
| 8,889,810 B2 | 11/2014 | Takeda et al. |
| 9,012,111 B2 | 4/2015 | Asai et al. |
| 9,091,919 B2 | 7/2015 | Urano et al. |
| 9,122,158 B2 | 9/2015 | Asai |
| 10,503,067 B2 | 12/2019 | Kato et al. |
| 10,982,053 B2 | 4/2021 | Maruyama et al. |
| 2008/0182087 A1 | 7/2008 | Kato et al. |
| 2009/0156753 A1 | 6/2009 | Sugo et al. |
| 2011/0061914 A1 | 3/2011 | Sekito |
| 2011/0076465 A1 | 3/2011 | Takeda et al. |
| 2011/0077364 A1 | 3/2011 | Tazaki et al. |
| 2011/0275768 A1 | 11/2011 | Yasuda et al. |
| 2012/0108762 A1 | 5/2012 | Kondo et al. |
| 2012/0235284 A1 | 9/2012 | Sugo et al. |
| 2013/0029145 A1 | 1/2013 | Kato et al. |
| 2013/0108866 A1 | 5/2013 | Kato et al. |
| 2013/0108876 A1 | 5/2013 | Komori et al. |
| 2013/0135763 A1 | 5/2013 | Liao et al. |
| 2013/0149645 A1 | 6/2013 | Takemura et al. |

(Continued)

FOREIGN PATENT DOCUMENTS

| | | |
|---|---|---|
| EP | 0927736 A1 | 7/1999 |
| EP | 1186624 B1 | 3/2003 |

(Continued)

OTHER PUBLICATIONS

Search Report dated Dec. 19, 2018, issued in counterpart EP Application No. 18187705.1 (9 pages).

(Continued)

*Primary Examiner* — Peter L Vajda
*Assistant Examiner* — Richard David Champion
(74) *Attorney, Agent, or Firm* — WHDA, LLP

(57) ABSTRACT

A photosensitive resin composition comprising a polymer containing a silphenylene skeleton and a fluorene skeleton and having a crosslinkable site in the molecule, a phenol compound having a Mw of 300-10,000, a photoacid generator, and a benzotriazole or imidazole compound has improved film properties. Even from a thick film, a fine size pattern can be formed.

6 Claims, No Drawings

(56) References Cited

U.S. PATENT DOCUMENTS

| | | | |
|---|---|---|---|
| 2013/0196114 A1* | 8/2013 | Urano | G03F 7/0757 |
| | | | 430/325 |
| 2013/0302983 A1 | 11/2013 | Tanabe et al. | |
| 2013/0323631 A1 | 12/2013 | Asai et al. | |
| 2016/0033865 A1 | 2/2016 | Takemura et al. | |
| 2016/0097973 A1 | 4/2016 | Urano et al. | |
| 2016/0315025 A1 | 10/2016 | Kondo et al. | |
| 2017/0198102 A1 | 7/2017 | Yanaizumi et al. | |
| 2017/0255097 A1 | 9/2017 | Takemura et al. | |
| 2018/0004088 A1 | 1/2018 | Maruyama et al. | |
| 2018/0224743 A1 | 8/2018 | Maruyama et al. | |
| 2019/0049844 A1 | 2/2019 | Maruyama et al. | |
| 2019/0354014 A1 | 11/2019 | Maruyama et al. | |
| 2020/0165364 A1 | 5/2020 | Higuchi | |
| 2020/0165394 A1 | 5/2020 | Maruyama et al. | |
| 2020/0201182 A1 | 6/2020 | Hirano et al. | |

FOREIGN PATENT DOCUMENTS

| | | | |
|---|---|---|---|
| EP | 1953183 A2 | 8/2008 | |
| EP | 1953183 A3 | 11/2008 | |
| EP | 2447304 A1 | 5/2012 | |
| EP | 2587530 A2 | 5/2013 | |
| EP | 1 953 183 B1 | 9/2013 | |
| EP | 2397508 B1 | 2/2016 | |
| EP | 3103835 A1 | 12/2016 | |
| EP | 3211661 A2 | 8/2017 | |
| EP | 3 214 497 A1 | 9/2017 | |
| EP | 3 358 412 A1 | 8/2018 | |
| JP | 8-32763 B2 | 3/1996 | |
| JP | H11-80362 A | 3/1999 | |
| JP | 2002-88158 A | 3/2002 | |
| JP | 2008-184571 A | 8/2008 | |
| JP | 2012-1668 A | 1/2012 | |
| JP | 2012-092268 A | 5/2012 | |
| JP | 2013-110391 A | 6/2013 | |
| JP | 2013-173920 A | 9/2013 | |
| JP | 2014-122276 A | 7/2014 | |
| JP | 2016-74874 A | 5/2016 | |
| JP | 2016125032 A * | 7/2016 | H01L 21/0274 |
| JP | 2018-002848 A | 1/2018 | |
| JP | 2018-124552 A | 8/2018 | |
| WO | 2016/076205 A1 | 5/2016 | |

OTHER PUBLICATIONS

Extended European Search Report dated Sep. 20, 2019, issued in counterpart EP application No. 19172966.4. (8 pages).

Non-Final Office Action dated Aug. 24, 2020, issued in U.S. Appl. No. 16/414,281 (16 pages).

Non-Final Office Action dated Sep. 18, 2020, issued in U.S. Appl. No. 16/056,711 (14 pages).

Li et a. "Synthesis and Properties of Polymers Containing Siphenylene Moiety via Catalytic Cross-Dehydrocoupling Polymerization of 1,4-Bis(dimethylsilyl)benzene" Macromolecules, 1999, 32, 8768-8773. (Year: 1999) (6 pages).

Final Office Action dated Mar. 11, 2022, issued in U.S. Appl. No. 16/056,629. (19 pages).

Non-Final Office Action dated Dec. 21, 2021, issued in U.S. Appl. No. 16/056,711. (11 pages).

Office Action dated Sep. 1, 2020, issued in JP Application No. 2017-153884 (counterpart to U.S. Appl. No. 16/056,711), with English translation. (18 pages).

Extended European Search Report dated Dec. 20, 2018, issued in EP Application No. 18187713.5 (counterpart to U.S. Appl. No. 16/056,629). (7 pages).

Non-Final Office Action dated Sep. 18, 2020, issued in U.S. Appl. No. 16/056,629. (16 pages).

Non-Final Office Action dated May 22, 2019, issued in U.S. Appl. No. 15/883,265. (9 pages).

Notice of Reasons for Refusal dated Aug. 25, 2020, issued in JP Application No. 2017-153901 (counterpart to U.S. Appl. No. 16/056,629), with English translation. (8 pages).

Non-Final Office Action dated Jun. 10, 2021, issued in U.S. Appl. No. 16/411,472. (18 pages).

Non-Final Office Action dated Jun. 10, 2021, issued in U.S. Appl. No. 16/676,591. (18 pages).

Non-Final Action dated Sep. 14, 2021, issued in U.S. Appl. No. 16/056,629 (12 pages).

\* cited by examiner

PHOTOSENSITIVE RESIN COMPOSITION, PHOTOSENSITIVE DRY FILM, AND PATTERN FORMING PROCESS

CROSS-REFERENCE TO RELATED APPLICATION

This non-provisional application claims priority under 35 U.S.C. § 119(a) on Patent Application No. 2018-237135 filed in Japan on Dec. 19, 2018, the entire contents of which are hereby incorporated by reference.

TECHNICAL FIELD

This invention relates to a photosensitive resin composition, photosensitive dry film, and pattern forming process.

BACKGROUND ART

In the prior art, photosensitive protective films for semiconductor chips and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition based on a silphenylene structure-containing silicone type polymer having improved flexibility. This composition has improved film properties, but a low resolution. A further improvement in resolution must be achieved before the composition can be used in highly integrated 3D packages.

CITATION LIST

Patent Document 1: JP-A 2008-184571 (U.S. Pat. No. 7,785,766, EP 1953183)

DISCLOSURE OF INVENTION

An object of the invention is to provide a photosensitive resin composition which forms a resin coating or film that has improved film properties and can be readily processed even in thick film form to form a fine size pattern. Another object is to provide a photosensitive dry film and a pattern forming process, using the composition.

The inventors have found that a photosensitive resin composition comprising a polymer containing silphenylene and fluorene skeletons and having a crosslinking group or reactive site capable of crosslinking reaction in the molecule, a phenol compound having a Mw of 300 to 10,000, a photoacid generator, and a benzotriazole compound and/or imidazole compound has a high resolution and is suited as resist material for plating.

In one aspect, the invention provides a photosensitive resin composition comprising (A) a polymer comprising repeating units having the formula (A1) and repeating units of at least one type selected from repeating units having the formula (A2) and repeating units having the formula (A3), shown below, (B) a phenol compound having a weight average molecular weight of 300 to 10,000, (C) a photoacid generator, (D) a benzotriazole compound and/or imidazole compound, and (E) an organic solvent.

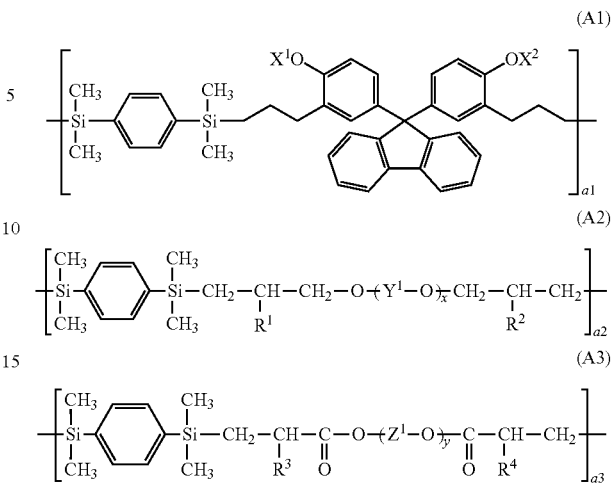

Herein $X^1$ and $X^2$ are each independently hydrogen or glycidyl group, $Y^1$ is a $C_1$-$C_5$ straight or branched alkanediyl group, $Z^1$ is a $C_1$-$C_{10}$ straight alkanediyl group which may contain hydroxyl, a $C_2$-$C_{10}$ branched alkanediyl group, or a divalent group having the formula (A4):

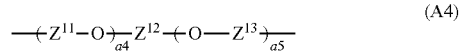

wherein $Z^{11}$ and $Z^{13}$ are each independently a $C_1$-$C_5$ straight or branched alkanediyl group, $Z^{12}$ is a $C_1$-$C_{30}$ divalent hydrocarbon group, $a^4$ and $a^5$ are each independently an integer of 1 to 50, $R^1$, $R^2$, $R^3$ and $R^4$ are each independently hydrogen or a $C_1$-$C_{10}$ monovalent hydrocarbon group, $a^1$, $a^2$ and $a^3$ are numbers in the range: $0<a^1<1$, $0 \le a^2 <1$, $0 \le a^3 <1$, and $a^1+a^2+a^3=1$, x and y are each independently an integer of 1 to 50.

Also provided is a photosensitive resin coating obtained from the photosensitive resin composition defined above.

In another aspect, the invention provides a photosensitive dry film comprising a support film and the photosensitive resin coating thereon.

In a further aspect, the invention provides a pattern forming process comprising the steps of (a) applying the photosensitive resin composition defined above onto a substrate to form a photosensitive resin coating thereon, (b) exposing the photosensitive resin coating to radiation, and (c) developing the exposed resin coating in an organic solvent.

In a still further aspect, the invention provides a pattern forming process comprising the steps of (a') using the photosensitive dry film defined above to form the photosensitive resin coating on a substrate, (b) exposing the photosensitive resin coating to radiation, and (c) developing the exposed resin coating in an organic solvent.

ADVANTAGEOUS EFFECTS OF INVENTION

The photosensitive resin composition and the photosensitive dry film of the invention have satisfactory properties as photosensitive material. From the composition or dry film, a film having a widely varying thickness can be formed. Even from a thick film, a fine size pattern of perpendicular profile can be formed.

DESCRIPTION OF PREFERRED EMBODIMENTS

As used herein, the notation (Cn-Cm) means a group containing from n to m carbon atoms per group. UV stands for ultraviolet radiation, and EB for electron beam.

Photosensitive Resin Composition

The invention provides a photosensitive resin composition comprising (A) a polymer containing a silphenylene skeleton and a fluorene skeleton and having a crosslinking group or reactive site capable of crosslinking reaction in the molecule, (B) a phenol compound having a weight average molecular weight of 300 to 10,000, (C) a photoacid generator, (D) a benzotriazole compound and/or imidazole compound, and (E) an organic solvent.

Component (A)

Component (A) is a polymer comprising repeating units having the formula (A1), and repeating units of at least one type selected from repeating units having the formula (A2) and repeating units having the formula (A3).

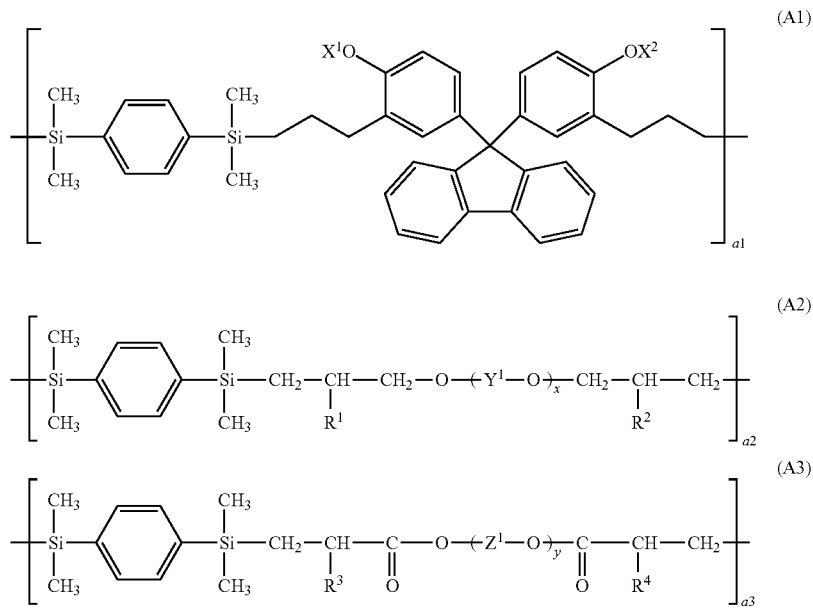

In formula (A1), $X^1$ and $X^2$ are each independently hydrogen or glycidyl group.

In formula (A2), $Y^1$ is a $C_1$-$C_5$ straight or branched alkanediyl group. Suitable alkanediyl groups include methylene, ethane-1,1-diyl, ethane-1,2-diyl, propane-1,1-diyl, propane-1,2-diyl, propane-1,3-diyl, propane-2,2-diyl, butane-1,2-diyl, butane-1,3-diyl, butane-1,4-diyl, and pentane-1,5-diyl. Preferably $Y^1$ is ethane-1,1-diyl, ethane-1,2-diyl, propane-1,1-diyl, propane-1,2-diyl, or propane-1,3-diyl.

In formula (A3), $Z^1$ is a $C_1$-$C_{10}$ straight alkanediyl group or a $C_2$-$C_{10}$ branched alkanediyl group, the straight alkanediyl group optionally containing hydroxyl. Alternatively, $Z^1$ is a divalent group having the formula (A4):

$$-\!\!+\!\!Z^{11}\!-\!\text{O}\!+\!\!\overline{_{a4}}Z^{12}\!-\!\!+\!\!\text{O}\!-\!Z^{13}\!+\!\!\overline{_{a5}}-\!\!\!-\quad\text{(A4)}$$

wherein $Z^{11}$ and $Z^{13}$ are each independently a $C_1$-$C_5$ straight or branched alkanediyl group, $Z^{12}$ is a $C_1$-$C_{30}$ divalent hydrocarbon group, $a^4$ and $a^5$ are each independently an integer of 1 to 50.

Examples of the straight alkanediyl group represented by $Z^1$ include methylene, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, and decane-1,10-diyl.

Examples of the hydroxyl-containing straight alkanediyl group include hydroxyl-substituted forms of pentane-1,5-diyl, hexane-1,6-diyl, heptane-1,7-diyl, octane-1,8-diyl, nonane-1,9-diyl, and decane-1,10-diyl, specifically 2-hydroxypropane-1,3-diyl, 2-hydroxybutane-1,4-diyl, and 3-hydroxypropane-1,4-diyl.

Examples of the $C_2$-$C_{10}$ branched alkanediyl group represented by $Z^1$ include ethane-1,1-diyl, propane-1,2-diyl, propane-2,2-diyl, butane-1,2-diyl, and butane-1,3-diyl.

Examples of the divalent group having formula (A4) are shown below, but not limited thereto.

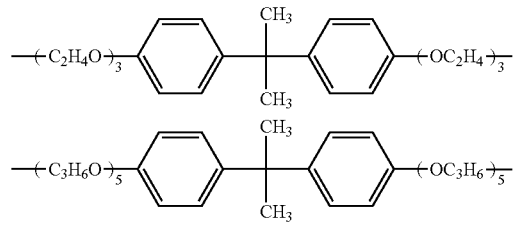

Of these, $Z^1$ is preferably selected from ethane-1,1-diyl, ethane-1,2-diyl, propane-1,2-diyl, propane-1,3-diyl, propane-2,2-diyl, butane-1,4-diyl, pentane-1,5-diyl, and hexane-1,6-diyl.

In formulae (A2) and (A3), $R^1$, $R^2$, $R^3$ and $R^4$ are each independently hydrogen or a $C_1$-$C_{10}$ monovalent hydrocarbon group. The monovalent hydrocarbon group may be straight, branched or cyclic and examples thereof include monovalent aliphatic hydrocarbon groups such as $C_1$-$C_{10}$ alkyl groups and monovalent aromatic hydrocarbon groups such as $C_6$-$C_{10}$ alkyl and $C_7$-$C_{10}$ aralkyl groups.

Suitable $C_1$-$C_{10}$ alkyl groups include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, norbornyl, and adamantyl. Suitable aryl groups include phenyl, 2-methylphenyl, 3-methylphenyl, 4-methylphenyl, 2-ethylphenyl, 3-ethylphenyl, 4-ethylphenyl, and dimethylphenyl. Suitable aralkyl groups include benzyl and phenethyl. Of these, $R^1$, $R^2$, $R^3$ and $R^4$ are preferably hydrogen or methyl.

In formulae (A1) to (A3), $a^2$ and $a^3$ are numbers in the range: $0<a^1<1$, $0\le a^2<1$, $0\le a^3<1$, and $a^1+a^2+a^3=1$; preferably in the range: $0.20\le a^1\le 0.95$, $0\le a^2\le 0.80$, $0\le a^3<0.80$, and $a^1+a^2+a^3=1$; more preferably in the range: $0.30\le a^1\le 0.95$, $0\le a^2\le 0.70$, $0\le a^3\le 0.70$, and $a^1+a^2+a^3=1$.

In formulae (A2) and (A3), x and y are each independently an integer of 1 to 50, preferably 2 to 40, more preferably 3 to 30.

The polymer as component (A) should preferably have a weight average molecular weight (Mw) of 3,000 to 80,000, more preferably 5,000 to 50,000. As long as Mw is in the range, even a thick film of the polymer has a sufficient resolution. Throughout the disclosure, Mw is measured versus polystyrene standards by gel permeation chromatography (GPC) using tetrahydrofuran (THF) as eluate.

The polymer may be prepared by combining a compound having the formula (1), a compound having the formula (2), and at least one of a compound having the formula (3) and a compound having the formula (4), and conducting addition polymerization in the presence of a metal catalyst. Notably these compounds are simply referred to as compounds (1), (2), (3), and (4).

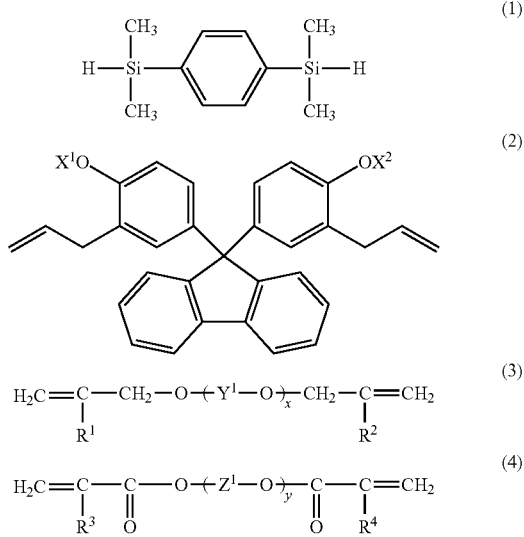

Herein $X^1$, $X^2$, $Y^1$, $Z^1$, $R^1$ to $R^4$, x and y are as defined above.

Examples of the metal catalyst used herein include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of compounds (1) to (4).

In the polymerization reaction, a solvent may be used, if desired. Suitable solvents are hydrocarbon solvents such as toluene and xylene. The polymerization temperature is preferably in a range of 40 to 150° C., more preferably 60 to 120° C., within which the catalyst is not deactivated and the polymerization can be completed within a short time. The polymerization time varies with the type and amount of the starting compounds. It is preferably about 0.5 to about 100 hours, more preferably about 0.5 to about 30 hours for preventing moisture entry into the polymerization system. After the completion of reaction, the solvent (if used) is distilled off, whereupon the polymer is obtained.

The reaction procedure is not particularly limited. The preferred procedure is by first mixing compound (2) with at least one of compounds (3) and (4), heating, adding a metal catalyst to the mixture, and then adding compound (1) dropwise over 0.1 to 5 hours.

In the polymerization reaction, the starting compounds are preferably combined in such amounts that a molar ratio of the hydrosilyl group on compound (1) to the total alkenyl group on compounds (2), (3) and (4) may range from 0.67 to 1.67, more preferably from 0.83 to 1.25.

The Mw of the polymer can be controlled using a molecular weight control agent such as a monoallyl compound (e.g., o-allylphenol), monohydrosilane (e.g., triethylhydrosilane) or monohydrosiloxane.

Component (B)

Component (B) is a phenol compound having a Mw of 300 to 10,000. The phenol compound is a compound having at least one phenolic hydroxyl group, typically a novolak resin. The novolak resin may be prepared by condensation reaction of a phenol or cresol with an aldehyde or ketone in the presence of an acid catalyst. Suitable acid catalysts include hydrochloric acid, formic acid and oxalic acid. Suitable phenols and cresols include phenol, o-cresol, m-cresol, p-cresol, o-ethylphenol, m-ethylphenol, 2,3-xylenol, 2,5-xylenol, and 3,5-xylenol. Suitable aldehydes and ketones include formaldehyde, benzaldehyde, acetaldehyde, and acetone.

Besides the novolak resins, component (B) may also be selected from polyhydroxystyrene, bisphenols, trisphenols, polyphenols, and compounds having the following formulae (B1), (B2) and (B3).

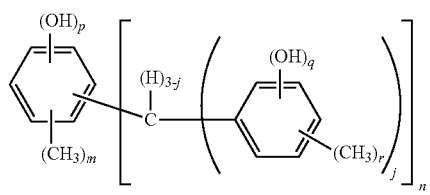

(B1)

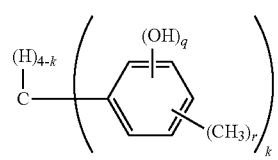

(B2)

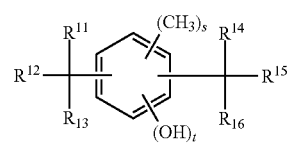

(B3)

In formula (B1), j is 1 or 2; m, p and r are each independently an integer of 0 to 3, q is an integer of 1 to 3, and n is an integer of 1 to 4, meeting $1 \leq m+n+p \leq 6$, and $1 \leq q+r \leq 5$.

In formula (B2), k is an integer of 2 or 3, q and r are as defined above.

In formula (B3), s and t are each independently an integer of 0 to 3, meeting $0 \leq s+t \leq 4$. $R^{11}$ to $R^{16}$ are each independently hydrogen, methyl, or a group having the formula (B4) below, with the proviso that at least one of $R^{11}$ to $R^{13}$ and at least one of $R^{14}$ to $R^{16}$ are a group having formula (B4) wherein u is an integer of 1 to 3.

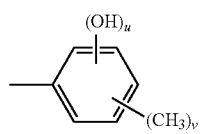

(B4)

In formula (B4), u and v are each independently an integer of 0 to 3, meeting $0 \leq u+v \leq 4$.

The amount of component (B) is preferably 0.2 to 50 parts, more preferably 0.5 to 40 parts, even more preferably 0.8 to 30 parts by weight per 100 parts by weight of component (A).

Component (C)

Component (C) is a photoacid generator which is not particularly limited as long as it is decomposed to generate an acid upon exposure to high-energy radiation. Examples of the high-energy radiation include UV, deep UV, and EB, specifically g-line, h-line, i-line, KrF excimer laser, ArF excimer laser, EB, and synchrotron radiation.

Suitable PAGs include onium salts (e.g., sulfonium and iodonium salts), sulfonyldiazomethane derivatives, N-sulfonyloxyimide PAGs, benzoin sulfonate PAGs, pyrogallol trisulfonate PAGs, nitrobenzyl sulfonate PAGs, sulfone PAGs, O-arylsulfonyloxime compound or O-alkylsulfonyloxime compound (oxime sulfonate) PAGs.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Further, salts of sulfonium cations with phosphoric acids, antimonic acids, alkylphosphoric acids and fluoroalkylphosphoric acids (i.e., some hydrogen on alkyl moiety is substituted by fluorine) are included.

Iodonium salts are salts of iodonium cations with sulfonate anions. Exemplary iodonium cations include aryl iodonium cations such as diphenyliodonium, bis(4-tert-butylphenyl)iodonium, 4-tert-butoxyphenylphenyliodonium, and 4-methoxyphenylphenyliodonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Suitable N-sulfonyloxyimide PAGs include imide compounds in which the nitrogen-bonded hydrogen is substituted by sulfonyloxy group. Suitable imide compounds include succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Suitable sulfonyloxy groups include trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Benzoinsulfonate PAGs include benzoin tosylate, benzoin mesylate, and benzoin butanesulfonate.

Pyrogallol trisulfonate PAGs include pyrogallol, phloroglucinol, catechol, resorcinol, and hydroquinone, in which all hydroxyl groups are substituted by sulfonyloxy groups such as trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, or methanesulfonyloxy.

Nitrobenzyl sulfonate PAGs include esters of nitrobenzyl alcohols with sulfonates, for example, 2,4-dinitrobenzyl sulfonates, 2-nitrobenzyl sulfonates, and 2,6-dinitrobenzyl sulfonates. Suitable sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group is substituted by trifluoromethyl.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compound and O-alkylsulfonyloxime compound (or oxime sulfonate) PAGs include photoacid generators in the form of glyoxime derivatives, oxime sulfonates with a long conjugated system separated by thiophene or cyclohexadiene, oxime sulfonates having an electron withdrawing group such as trifluoromethyl incorporated for increased stability, oxime sulfonates using phenylacetonitrile or substituted acetonitrile derivatives, and bisoxime sulfonates.

Glyoxime derivative PAGs include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedionedioxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(4-fluorobenzenesulfonyl)-α-dimethylglyoxime,
bis-O-(4-trifluoromethylbenzenesulfonyl)-α-dimethylglyoxime,
bis-O-(xylenesulfonyl)-α-dimethylglyoxime, bis-O-(trifluoromethanesulfonyl)nioxime,
bis-O-(2,2,2-trifluoroethanesulfonyl)nioxime, bis-O-(10-camphorsulfonyl)nioxime,
bis-O-(benzenesulfonyl)nioxime, bis-O-(4-fluorobenzenesulfonyl)nioxime,
bis-O-(4-(trifluoromethyl)benzenesulfonyl)nioxime, and bis-O-(xylenesulfonyl)nioxime.

Photoacid generators in the form of oxime sulfonates with a long conjugated system separated by thiophene or cyclohexadiene include
(5-(p-toluenesulfonyl)oxyimino-5H-thiophen-2-ylidene) phenylacetonitrile,
(5-(10-camphorsulfonyl)oxyimino-5H-thiophen-2-ylidene) phenylacetonitrile,
(5-n-octanesulfonyloxyimino-5H-thiophen-2-ylidene)phenylacetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile,
(5-(4-(p-toluenesulfonyloxy)benzenesulfonyl)oxyimino-5H-thiophen-2-ylidene)-phenylacetonitrile, and
(5-(2,5-bis(p-toluenesulfonyloxy)benzenesulfonyl)oxyimino-5H-thiophen-2-ylidene)-phenylacetonitrile.

Suitable oxime sulfonates having an electron withdrawing group such as trifluoromethyl incorporated for increased stability include
2,2,2-trifluoro-1-phenylethanone O-(methylsulfonyl)oxime,
2,2,2-trifluoro-1-phenylethanone O-(10-camphorsulfonyl)oxime,
2,2,2-trifluoro-1-phenylethanone O-(4-methoxybenzenesulfonyl)oxime,
2,2,2-trifluoro-1-phenylethanone O-(1-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl)oxime,
2,2,2-trifluoro-1-(4-methylphenyl)ethanone O-(10-camphorsulfonyl)oxime,
2,2,2-trifluoro-1-(4-methylphenyl)ethanone O-(methylsulfonyl)oxime,
2,2,2-trifluoro-1-(2-methylphenyl)ethanone O-(10-camphorsulfonyl)oxime,
2,2,2-trifluoro-1-(2,4-dimethylphenyl)ethanone O-(10-camphorsulfonyl)oxime,
2,2,2-trifluoro-1-(2,4-dimethylphenyl)ethanone O-(1-naphthylsulfonyl)oxime,
2,2,2-trifluoro-1-(2,4-dimethylphenyl)ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methylsulfonyl)oxime,
2,2,2-trifluoro-1-(4-methylthiophenyl)ethanone O-(methylsulfonyl)oxime,
2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime,
2,2,2-trifluoro-1-(4-methoxyphenyl)ethanone O-(4-methoxyphenylsulfonyl)oxime,
2,2,2-trifluoro-1-(4-methoxyphenyl)ethanone O-(4-dodecylphenylsulfonyl)oxime,
2,2,2-trifluoro-1-(4-methoxyphenyl)ethanone O-(octylsulfonyl)oxime,
2,2,2-trifluoro-1-(4-thiomethylphenyl)ethanone O-(4-methoxyphenylsulfonyl)oxime,
2,2,2-trifluoro-1-(4-thiomethylphenyl)ethanone O-(4-dodecylphenylsulfonyl)oxime,
2,2,2-trifluoro-1-(4-thiomethylphenyl)ethanone O-(octylsulfonyl)oxime,
2,2,2-trifluoro-1-(4-thiomethylphenyl)ethanone O-(2-naphthylsulfonyl)oxime,
2,2,2-trifluoro-1-(2-methylphenyl)ethanone O-(methylsulfonyl)oxime,
2,2,2-trifluoro-1-(4-methylphenyl)ethanone O-(phenylsulfonyl)oxime,
2,2,2-trifluoro-1-(4-chlorophenyl)ethanone O-(phenylsulfonyl)oxime,
2,2,3,3,4,4,4-heptafluoro-1-phenylbutanone O-(10-camphorsulfonyl)oxime,
2,2,2-trifluoro-1-(1-naphthyl)ethanone O-(methylsulfonyl)oxime,
2,2,2-trifluoro-1-(2-naphthyl)ethanone O-(methylsulfonyl)oxime,
2,2,2-trifluoro-1-(4-benzylphenyl)ethanone O-(methylsulfonyl)oxime,
2,2,2-trifluoro-1-(4-(phenyl-1,4-dioxa-but-1-yl)phenyl)ethanone O-(methylsulfonyl)oxime,
2,2,2-trifluoro-1-(1-naphthyl)ethanone O-(propylsulfonyl)oxime,
2,2,2-trifluoro-1-(2-naphthyl)ethanone O-(propylsulfonyl)oxime,
2,2,2-trifluoro-1-(4-benzylphenyl)ethanone O-(propylsulfonyl)oxime,
2,2,2-trifluoro-1-(4-methylsulfonylphenyl)ethanone O-(propylsulfonyl)oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxapent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl)oxime,
2,2,2-trifluoro-1-(2-thiophenyl)ethanone O-(propylsulfonate)oxime,
2,2,2-trifluoro-1-(1-dioxathiophen-2-yl)ethanone O-(propylsulfonate)oxime,
2,2,2-trifluoro-1-(4-(3-(4-(2,2,2-trifluoro-1-(trifluoromethanesulfonyloxyimino)ethyl)phenoxy)propoxy)phenyl)ethanone O-(trifluoromethanesulfonyl)oxime,
2,2,2-trifluoro-1-(4-(3-(4-(2,2,2-trifluoro-1-(1-propanesulfonyloxyimino)ethyl)phenoxy)propoxy)phenyl)ethanone O-(propylsulfonyl)oxime,
2,2,2-trifluoro-1-(4-(3-(4-(2,2,2-trifluoro-1-(1-butanesulfonyloxyimino)ethyl)phenoxy)propoxy)phenyl)ethanone O-(butylsulfonyl)oxime,
2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone O-(4-(4-methylphenylsulfonyloxy)phenylsulfonyl)oxime, and
2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone O-((2,5-bis(4-methylphenylsulfonyloxy)benzenesulfonyloxy)phenylsulfonyl)oxime.

Suitable oxime sulfonate PAGs using substituted acetonitrile derivatives include α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonate PAGs include
bis(α-(p-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(p-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile, bis(α-(trifluoromethanesulfonyloxy)imino)-m-phenylenediacetonitrile, and bis(α-(4-methoxybenzenesulfonyloxy)imino)-m-phenylenediacetonitrile.

Also oxime sulfonates having the formula ($C_1$) are useful PAGs.

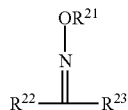
(C1)

Herein $R^{21}$ is a substituted or unsubstituted $C_1$-$C_{10}$ haloalkylsulfonyl or halobenzenesulfonyl group, $R^{22}$ is a $C_1$-$C_{11}$ haloalkyl group, and $R^{23}$ is a substituted or unsubstituted aryl or hetero-aryl group.

Examples include

2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-(nonafluorobutylsulfonyloxyimino)hexyl]fluorene, 2-[2,2,3,3,4,4,5,5-octafluoro-1-(nonafluorobutylsulfonyloxyimino)pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid. Where reaction with high sensitivity is necessary, phosphate anions and alkylphosphate anions in which some hydrogen is substituted by fluorine may be used.

The PAG (C) is preferably added in an amount of 0.2 to 20 parts, more preferably 0.3 to 10 parts by weight per 100 parts by weight of component (A). The amount of PAG in the range ensures a practically acceptable sensitivity and pattern profile. The PAG may be used alone or in admixture of two or more. The transmittance of the resin film can be controlled by using a PAG having a low transmittance at the exposure wavelength and adjusting the amount of the PAG added.

Component (D)

Component (D) is at least one compound selected from a benzotriazole compound and an imidazole compound.

The benzotriazole compound is typically selected from compounds having the formulae (D1) and (D2).

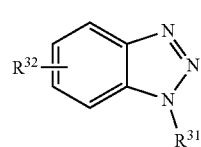
(D1)

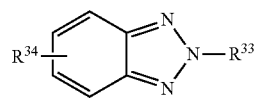
(D2)

In formulae (D1) and (D2), $R^{31}$ and $R^{33}$ are each independently hydrogen, hydroxyl, amino, a substituted or unsubstituted $C_1$-$C_6$ alkyl, substituted or unsubstituted phenyl, sulfonyl-containing substituent group, or -$A^1$-$A^2$. $A^1$ is carbonyl, $C_1$-$C_{12}$ alkanediyl, $C_3$-$C_{12}$ cycloalkylene or —$A^{11}$—O— wherein $A^{11}$ is a $C_1$-$C_{12}$ alkanediyl group. $A^2$ is hydrogen, halogen, cyano, hydroxyl, $C_1$-$C_6$ alkoxy, carboxyl, or dialkylamino group in which each alkyl moiety is of $C_1$-$C_6$.

In formulae (D1) and (D2), $R^{32}$ and $R^{34}$ are each independently hydrogen, halogen, hydroxyl, optionally substituted $C_1$-$C_6$ alkyl, $C_1$-$C_6$ alkoxy, sulfonyl-containing substituent group, or an organic group of the formula (D3):

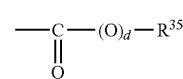
(D3)

wherein $R^{35}$ is hydrogen or optionally substituted $C_1$-$C_{12}$ alkyl, and d is 0 or 1.

Examples of the benzotriazole compound include benzotriazole, 1-hydroxybenzotriazole, 1-methylbenzotriazole, 1-hydroxymethylbenzotriazole, 1-ethylbenzotriazole, 1-(1-hydroxyethyl)benzotriazole, 1-(2-hydroxyethyl)benzotriazole, 1-propylbenzotriazole, 1-(1-hydroxypropyl)benzotriazole, 1-(2-hydroxypropyl)benzotriazole, 1-(3-hydroxypropyl)benzotriazole, 4-hydroxy-1H-benzotriazole, 5-methyl-1H-benzotriazole, benzotriazole-5-carboxylic acid, 1-methylbenzotriazole-5-carboxylic acid, 1-ethylbenzotriazole-5-carboxylic acid, 1-t-butylbenzotriazole-5-carboxylic acid, 1-(2-cyclopentylethyl)benzotriazole-5-carboxylic acid, 1H-benzotriazole-4-sulfonic acid, 1H-benzotriazole-1-acetonitrile, 1H-benzotriazole-1-carboxyaldehyde, 2-methyl-2H-benzotriazole, and 2-ethyl-2H-benzotriazole.

The imidazole compound is typically selected from compounds having the formulae (D4) to (D9).

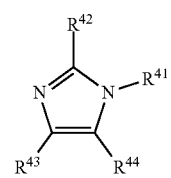
(D4)

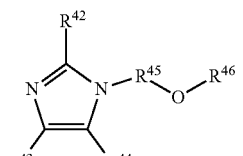
(D5)

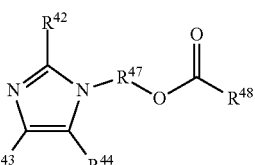
(D6)

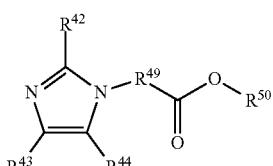
(D7)

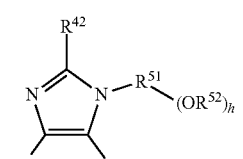
(D8)

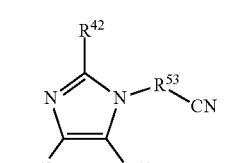
(D9)

In formulae (D4) to (D9), $R^{41}$ is hydrogen, or a $C_2$-$C_{20}$ alkyl group having at least one polar functional moiety selected from among hydroxyl, carbonyl, ester, ether, sulfide, carbonate, cyano and acetal. $R^{42}$, $R^{43}$ and $R^{44}$ are each independently hydrogen, a $C_1$-$C_{10}$ alkyl, $C_6$-$C_{10}$ aryl or $C_7$-$C_{10}$ aralkyl group. $R^{45}$, $R^{47}$, $R^{49}$ and $R^{53}$ are each independently a $C_1$-$C_{10}$ alkanediyl group. $R^{46}$ and $R^{48}$ are each independently hydrogen or a $C_1$-$C_{15}$ alkyl group which may contain at least one moiety selected from among hydroxyl, carbonyl, ester, ether, sulfide, carbonate, cyano and acetal. $R^{50}$ is a $C_1$-$C_{15}$ alkyl group which may contain at least one moiety selected from among hydroxyl, carbonyl, ester, ether, sulfide, carbonate, cyano and acetal. $R^{51}$ is a (h+1)-valent $C_2$-$C_{10}$ hydrocarbon group. $R^{52}$ is each independently hydrogen or a $C_1$-$C_{15}$ alkyl group which may contain at least one moiety selected from among hydroxyl, carbonyl, ester, ether, sulfide, carbonate, cyano and acetal, or two $R^{52}$ groups may bond together to form a ring, and h is 2, 3, 4 or 5.

Preferred examples of the imidazole compound include imidazole, 2-methylimidazole, 1,2-dimethylimidazole, 2-ethyl-4-methylimidazole, 2-phenylimidazole, 2-phenyl-4-methylimidazole, 1-methoxymethylimidazole, N-tert-butoxycarbonylimidazole, 1-(2-cyanoethyl)-2-methylimidazole, 1-(2-hydroxyethyl)imidazole, 1-(carboxymethyl) imidazole, and 2-methyl-1-vinylimidazole.

Component (D) is preferably used in an amount of 0.01 to 10 parts, more preferably 0.02 to 5 parts by weight per 100 parts by weight of component (A). An amount of component (D) in the range ensures to form a pattern at a practically acceptable sensitivity.

Component (E)

The organic solvent as component (E) is not particularly limited as long as other components are soluble therein and satisfactory coating properties are achievable. Suitable organic solvents include cellosolve solvents such as methyl cellosolve, ethyl cellosolve, methyl cellosolve acetate, and ethyl cellosolve acetate; propylene glycol solvents such as propylene glycol and dipropylene glycol; propylene glycol alkyl ether solvents such as propylene glycol monomethyl ether (PGME) and propylene glycol monobutyl ether; propylene glycol alkyl ether acetate solvents such as propylene glycol monomethyl ether acetate (PGMEA), propylene glycol dimethyl ether, and propylene glycol monoethyl ether acetate; ester solvents such as butyl acetate, pentyl acetate, methyl lactate, ethyl lactate, methyl 3-methoxypropionate, and ethyl 3-ethoxypropionate; alcohol solvents such as methanol, ethanol, isopropanol, butanol, hexanol, and diacetone alcohol; ketone solvents such as acetone, cyclohexanone, cyclopentanone, methyl ethyl ketone, methyl pentyl ketone, and methyl isobutyl ketone; ether solvents such as methyl phenyl ether and diethylene glycol dimethyl ether; highly polar solvents such as N,N-dimethylformamide, N-methylpyrrolidone and dimethyl sulfoxide; and mixtures thereof Of these solvents, propylene glycol alkyl ether acetates, alkyl lactates, and alkyl ketones are preferred. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. Also, the alkyl group of the alkyl lactate is preferably of 1 to 4 carbon atoms, for example, methyl, ethyl and propyl, with methyl and ethyl being especially preferred. The alkyl group of the alkyl ketone is preferably of 1 to 10 carbon atoms, for example, methyl, ethyl, propyl, isobutyl, cyclopentyl and cyclohexyl, with isobutyl, cyclopentyl and cyclohexyl being especially preferred.

The amount of component (E) is preferably 20 to 90% by weight, more preferably 25 to 70% by weight of the composition. An amount of component (E) in the range ensures to form a film with a uniform thickness and avoids the risk of defects in the film.

Other components

In addition to the aforementioned components, the photosensitive resin composition may contain additives, for example, surfactants. Examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and polyether silicone; fluorochemical surfactants such as EFTOP® EF301, EF303 and EF352 (Tohkem Products Co., Ltd.), Megaface® F171, F172 and F173 (DIC Corp.), Fluorad® FC-4430, FC-430 and FC-431 (Sumitomo 3M Co., Ltd.), Surfynol® E1004 (Nissin Chemical Industry Co., Ltd.), Asahiguard® AG710, Surflon0 S-381, S-382, $SC_{101}$, $SC_{102}$, $SC_{103}$, $SC_{104}$, $SC_{105}$, $SC_{106}$, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430 and X-70-093 are preferred. These surfactants may be used alone or in admixture.

The surfactant is preferably formulated in an amount of up to 5 parts, and more preferably up to 2 parts by weight per 100 parts by weight of component (A).

In the resin composition, other optional components may be added, for example, light absorbing substances for reducing diffuse reflection from the substrate (e.g., dyes), compounds having 1,2-naphthoquinonediazidesulfonyl group in the molecule, basic compounds, sensitizers, crosslinkers, photobase generators, and acid amplifiers. Such optional components may be added in conventional amounts as long as they do not compromise the benefits of the invention.

The photosensitive resin composition may be prepared by any conventional methods, for example, by dissolving components (A) to (D) and optional components in an organic solvent (E) at the same time or in an arbitrary order, to form a uniform solution of photosensitive resin composition. If necessary, the resulting solution may be passed through a filter.

Pattern Forming Process Using Photosensitive Resin Composition

Another embodiment of the invention is a pattern forming process using the photosensitive resin composition defined above, the process comprising the steps of (a) applying the photosensitive resin composition onto a substrate to form a photosensitive resin coating thereon, (b) exposing the photosensitive resin coating to radiation, and (c) developing the exposed resin coating in an organic solvent.

In step (a), a photosensitive resin coating is formed on a substrate using the photosensitive resin composition. Examples of the substrate include substrates of Si, $SiO_2$, SiN, SiON, TiN, WSi, BPSG, and SOG, metal substrates of Au, Ti, W, Cu, Ni—Fe, Ta, Zn, Co and Pb, and organic antireflection coatings.

In forming the photosensitive resin coating, typically the photosensitive resin composition is applied onto the substrate by a suitable coating technique, for example, spin coating, roll coating, flow coating, dipping, spraying, doctor blade coating or the like, in such a coating weight that the coating may have a desired thickness. If necessary, the coating is prebaked on a hot plate or in an oven at 60 to 150° C. for 0.5 to 120 minutes, preferably at 80 to 130° C. for 1 to 90 minutes.

Next, in step (b), the photosensitive resin coating is exposed to radiation. The exposure preferably uses radiation of wavelength at least 300 nm, more preferably 300 to 500 nm. Examples of radiation include UV radiation such as g-line and i-line. An appropriate exposure dose is about 1 to 5,000 $mJ/cm^2$, more preferably about 10 to 4,000 $mJ/cm^2$.

Exposure may be made through a photomask. The photomask may be, for example, one perforated with a desired pattern. Although the material of the photomask is not particularly limited, a material capable of shielding radiation in the above wavelength range is preferred. For example, a mask having a light-shielding film of chromium is used.

The next step may be post-exposure bake (PEB). PEB is typically performed on a hot plate or in an oven at 60 to 150° C. for 1 to 90 minutes, preferably at 80 to 130° C. for 1 to 60 minutes.

The exposure or PEB is followed by the step (c) of developing the exposed resin coating in an organic solvent. The organic solvent is preferably selected from alcohols such as isopropyl alcohol (IPA), ketones such as cyclohexanone, and glycols such as PGME and PGMEA. The solvent used in the photosensitive resin composition is also useful.

Development is effected by a conventional mode, for example, a dip, puddle or spray mode. The development is followed by washing, rinsing and drying if necessary. In this way, a photosensitive resin coating having the desired pattern is obtained. Although the developing time is selected depending on the thickness of the photosensitive resin coating, the time is typically 0.1 to 180 minutes, preferably 0.5 to 120 minutes.

Photosensitive Dry Film

A further embodiment of the invention is a photosensitive dry film comprising a support film and the photosensitive resin coating thereon.

A dry film is generally manufactured in a clean room having a cleanness of up to 1,000. The clean room includes a zone kept at a temperature of 5 to 45° C., preferably 15 to 35° C. and a humidity of 5 to 90%, preferably 10 to 70%, where a film coater is set. Examples of the film coater include a forward roll coater, reverse roll coater, comma coater, die coater, lip coater, gravure coater, dip coater, air knife coater, capillary coater, raising and rising (R&R) coater, blade coater, bar coater, applicator, and extrusion molding machine. By means of the film coater, the photosensitive resin composition is coated onto a support film, e.g., thermoplastic film or parting substrate. The coating speed is preferably 0.05 to 1,000 m/min, more preferably 0.1 to 500 m/min.

After coating of the resin composition, the coated support is passed through an in-line dryer or hot air circulating oven preferably at 40 to 130° C. for 1 to 40 minutes, more preferably at 50 to 120° C. for 2 to 30 minutes, until the organic solvent and any volatiles are removed. By drying in this way, a photosensitive resin coating or film is formed on the support. A photosensitive dry film may also be constructed through solvent removal by infrared irradiation instead of the in-line dryer, or a combination of plural drying means such as simultaneous use of in-line dryer and infrared irradiation. If necessary, a protective film (or another parting substrate) may be press bonded to the photosensitive resin coating by means of a roll laminator, yielding a laminate.

Preferably, the photosensitive resin coating formed on the support film has a thickness of 10 to 700 µm, more preferably 50 to 600 µm, and an organic solvent content of 0 to 15% by weight.

In one embodiment, the photosensitive resin coating may be continuously formed on the support film to yield a length of photosensitive dry film, which is wound up in film roll form which is easy to handle. This is also true when the photosensitive dry film is overlaid with the protective film.

The support film and (optional) protective film are not particularly limited as long as the film does not adversely affect the shape of the photosensitive dry film and can be separated from the photosensitive resin coating. The film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which has been treated with a parting agent.

Of these, films of PET and PE are preferred as the protective film because of appropriate flexibility. Commercial available films may be used as well. Useful PET films include E-7301, E-7302 and E-7304 (Toyobo Co., Ltd.). Useful PE films include GF-8 (Tamapoly Co., Ltd.), PE FILM 0 TYPE (Nippa Corp.), Toretec 7332, Toretec 7111 and Toretec 7721 (Toray Advanced Film Co., Ltd.).

The support film and the protective film each have a thickness of preferably 10 to 150 μm, more preferably 25 to 100 μm, from the viewpoints of consistent film formation and anti-curling from the roll state wound around the windup mandrel.

Pattern Forming Process Using Photosensitive Dry Film

A still further embodiment of the invention is a pattern forming process comprising the steps of (a') using the photosensitive dry film to form the photosensitive resin coating on a substrate, (b) exposing the photosensitive resin coating to radiation, and (c) developing the exposed resin coating in an organic solvent.

In step (a'), the photosensitive dry film is used to form the photosensitive resin coating on a substrate. The substrate is selected from plastic films or sheets, semiconductor substrates of Si, SiO$_2$, SiN, SiON, TiN, WSi, BPSG and SOG, metal substrates of Au, Ti, W, Cu, Ni-Fe, Ta, Zn, Co and Pb, and organic substrates such as organic antireflective coatings. The substrate may have steps (raised and recessed portions) on its surface, which are typically left after formation of a circuit or dielectric resin layer by plating or sputtering. Such steps are preferably in the range of 0 to about 500 more preferably about 3 to 400 even more preferably about 5 to 300

The photosensitive dry film is bonded to the substrate using a suitable laminator such as vacuum laminator or roll laminator, after which the support is peeled whereby the photosensitive resin coating is transferred to the substrate. The substrate may be of a stepped structure as mentioned above. In this case, the photosensitive resin coating having an appropriate thickness corresponding to the height of steps is used so that the photosensitive resin coating may be buried in steps. The photosensitive resin coating is advantageously applicable to a substrate having steps of the order of 0 to 500 μm. The transfer step may or may not be followed by prebake. When prebake is performed, the assembly may be prebaked on a hotplate or in an oven at 60 to 150° C. for 1 to 90 minutes, preferably at 80 to 130° C. for 1 to 30 minutes.

Step (a') is followed by steps (b) and (c) in the same manner as in the pattern forming process using the photosensitive resin composition.

Plating Step

After the development step, electroplating or electroless plating may be carried out to form a metal plating layer on the resin pattern-bearing substrate. That is, a metal plating pattern is obtained. The plating step may be any of standard electroplating or electroless plating methods to deposit a conductor pattern, after which the resin (or resist) pattern is removed.

Suitable electroplating or electroless plating methods include electrolytic Cu plating, electroless Cu plating, electrolytic Ni plating, electroless Ni plating, and electrolytic Au plating. Plating may be performed in any well-known plating baths and under standard conditions. The thickness of a plating layer is typically 80 to 100% of the thickness of the resist pattern. For example, a resist pattern of 1μm thick is formed on a seed layer of Cu, after which a Cu plating pattern of 0.8 to 1.2 μm thick is deposited thereon by electrolytic Cu plating.

EXAMPLES

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran eluent, and column temperature 40° C. Parts are by weight (pbw).

Compounds (M-1) to (M-5) used in Synthesis Examples are shown below.

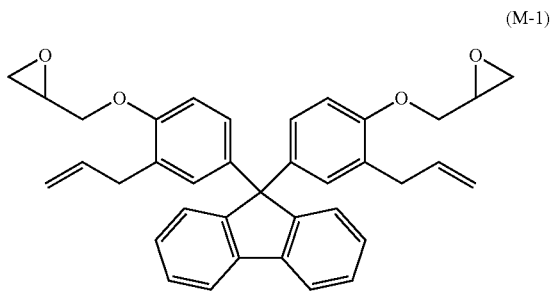

(M-1)

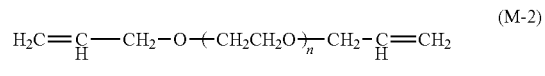

(M-2)

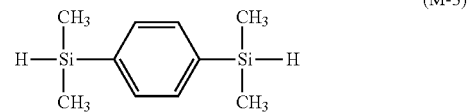

(M-3)

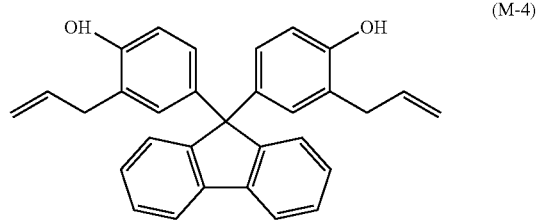

(M-4)

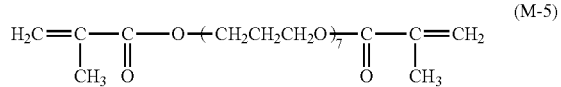

(M-5)

[1] Synthesis of Polymers

Synthesis Example 1

Synthesis of Poly-1

A 3-L flask equipped with a stirrer, thermometer, nitrogen purge line and reflux condenser was charged with 172.1 g (0.40 mol) of Compound (M-1), 53.9 g (0.10 mol) of Compound (M-2) with Mw~500 (Uniox® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-1. Poly-1 had a Mw of 38,000 and was identified by $^1$H-NMR spectroscopy (Bruker Corp.) to be the desired polymer.

Synthesis Example 2

Synthesis of Poly-2

A 3-L flask equipped with a stirrer, thermometer, nitrogen purge line and reflux condenser was charged with 217.1 g (0.40 mol) of Compound (M-4), 53.9 g (0.10 mol) of Compound (M-2) with Mw~500 (Uniox® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-2. Poly-2 had a Mw of 40,000 and was identified by $^1$H-NMR spectroscopy (Bruker Corp.) to be the desired polymer.

Synthesis Example 3

Synthesis of Poly-3

A 3-L flask equipped with a stirrer, thermometer, nitrogen purge line and reflux condenser was charged with 217.1 g (0.40 mol) of Compound (M-4), 70.4 g (0.10 mol) of Compound (M-5) (Blemmer® by NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of Compound (M-3) was added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Poly-3. Poly-3 had a Mw of 35,000 and was identified by $^1$H-NMR spectroscopy (Bruker Corp.) to be the desired polymer.

[2] Preparation of Photosensitive Resin Composition

Examples 1-1 to 1-11 and Comparative Examples 1-1 to 1-5

Photosensitive resin compositions 1 to 16 were prepared by mixing the polymer (Poly-1, Poly-2 or Poly-3), photoacid generator (PAG-1 or PAG-2), phenol compound (Ph-1, Ph-2 or Ph-3), benzotriazole compound (BTA-1 or BTA-2), imidazole compound (4-MI), organic solvent(cyclopentanone) and optional additive in accordance with the formulation shown in Table 1, and filtering through a membrane filter with a pore size of 1.0 μm. All the compositions contained 0.10 pbw of surfactant KP-341 (Shin-Etsu Chemical Co., Ltd.).

In Table 1, PAG-1, PAG-2, Ph-1, Ph-2, Ph-3, BTA-1, BTA-2, 4-MI, and Nikalac MW-390 are identified below.

PAG-1: PAI-101 (by Midori Kagaku Co., Ltd., 4-methylphenylsulfonyloxyimino-α-(4-methoxyphenyl)acetonitrile)
PAG-2: CPI-200K (San-Apro Ltd.)
Ph-1: EP 6050G (Asahi Yukizai Corp., m-cresol/p-cresol=40/60, Mw=2,500-4,000)
Ph-2: Maruka Lyncur M S-2P (Maruzen Petrochmical Co., Ltd., poly-p-vinylphenol, Mw=5,000)
Ph-3: Tris P-PA (Honshu Chemical Industry Co., Ltd., α,α-bis(4-hydroxyphenyl)-4-(4-hydroxy-α,α-dimethylbenzyl)ethylbenzene)
BTA-1, BTA-2, 4-MI:

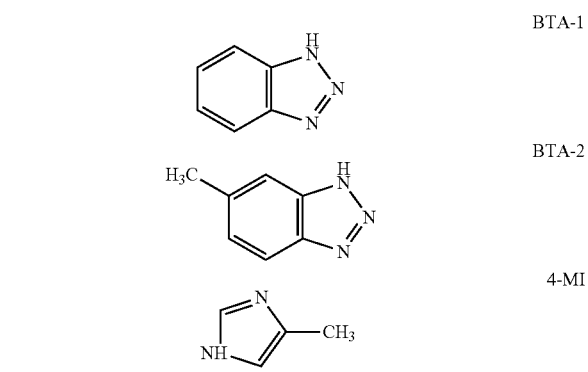

Nikalac MW-390: hexamethoxymethylmelamine (Sanwa Chemical Co., Ltd.)

TABLE 1

|  |  | Photosensitive resin composition | Component (A) (pbw) | Component (B) (pbw) | Component (C) (pbw) | Component (D) (pbw) | Component (E) (pbw) | Additive (pbw) |
|---|---|---|---|---|---|---|---|---|
| Example | 1-1 | 1 | Poly-1 (100) | Ph-1 (1.0) | PAG-1 (1.0) | BTA-1 (0.02) | cyclopentanone (65) | — |
|  | 1-2 | 2 | Poly-2 (100) | Ph-2 (5.0) | PAG-1 (1.0) | BTA-1 (0.05) | cyclopentanone (65) | — |
|  | 1-3 | 3 | Poly-3 (100) | Ph-2 (10.0) | PAG-1 (0.5) | BTA-1 (0.10) | cyclopentanone (65) | — |
|  | 1-4 | 4 | Poly-1 (100) | Ph-3 (10.0) | PAG-1 (2.0) | BTA-2 (0.02) | cyclopentanone (65) | — |

TABLE 1-continued

| Photosensitive resin composition | | Component (A) (pbw) | Component (B) (pbw) | Component (C) (pbw) | Component (D) (pbw) | Component (E) (pbw) | Additive (pbw) |
|---|---|---|---|---|---|---|---|
| | 1-5 | 5 | Poly-2 (100) | Ph-3 (10.0) | PAG-1 (1.0) | BTA-2 (0.10) | cyclopentanone (65) | — |
| | 1-6 | 6 | Poly-1 (100) | Ph-1 (1.0) | PAG-2 (1.5) | BTA-2 (0.05) | cyclopentanone (65) | — |
| | 1-7 | 7 | Poly-2 (100) | Ph-1 (5.0) | PAG-2 (1.5) | BTA-1 (0.02) | cyclopentanone (65) | — |
| | 1-8 | 8 | Poly-3 (100) | Ph-2 (5.0) | PAG-2 (1.0) | BTA-2 (0.02) | cyclopentanone (65) | — |
| | 1-9 | 9 | Poly-2 (100) | Ph-3 (5.0) | PAG-2 (1.0) | BTA-1 (0.10) | cyclopentanone (65) | — |
| | 1-10 | 10 | Poly-3 (100) | Ph-3 (20.0) | PAG-2 (1.0) | BTA-2 (0.05) | cyclopentanone (65) | — |
| | 1-11 | 11 | Poly-1 (100) | Ph-1 (1.0) | PAG-2 (1.5) | 4-MI (0.05) | cyclopentanone (65) | — |
| Comparative Example | 1-1 | 12 | Poly-1 (100) | — | PAG-1 (1.0) | BTA-1 (0.02) | cyclopentanone (65) | — |
| | 1-2 | 13 | Poly-2 (100) | Ph-1 (1.0) | PAG-1 (1.0) | — | cyclopentanone (65) | — |
| | 1-3 | 14 | Poly-3 (100) | Ph-3 (5.0) | PAG-2 (1.0) | — | cyclopentanone (65) | — |
| | 1-4 | 15 | Poly-1 (100) | — | PAG-2 (1.0) | — | cyclopentanone (65) | triethanolamine (0.05) |
| | 1-5 | 16 | Poly-2 (100) | — | PAG-2 (1.0) | — | cyclopentanone (65) | Nikalac MW-390 (10.0) |

[3] Pattern Formation From Photosensitive Resin Composition and Evaluation

Examples 2-1 to 2-11 and Comparative Examples 2-1 to 2-5

Each of photosensitive resin compositions 1 to 16 was spin coated on a 8-inch silicon wafer having Cu deposited thereon by sputtering and prebaked on a hotplate at 110° C. for 5 minutes to form a photosensitive resin coating of 100 μm thick. Using an i-line stepper (NSR-2205i11D by Nikon Corp.), the photosensitive resin coating was exposed to i-line through a reticle. The resin coating was PEB at 100° C. for 2 minutes, spray developed in PGMEA for 15 minutes, and dried, forming a pattern.

Using a scanning electronmicroscope (S-4700 by Hitachi High-Technologies Corp.), the pattern was analyzed for exposure dose, resolution and pattern profile. The optimum dose is an exposure dose at which a hole pattern with a size of 50 μm is printed to 50 μm. The resolution is the mask size through which a minimum hole pattern is resolved at the optimum dose.

TABLE 2

| | | Optimum dose (mJ/cm$^2$) | Resolution (μm) | Pattern profile |
|---|---|---|---|---|
| Example | 2-1 | 1,800 | 10 | rectangular |
| | 2-2 | 2,200 | 10 | rectangular |
| | 2-3 | 3,200 | 10 | rectangular |
| | 2-4 | 1,400 | 8 | rectangular |
| | 2-5 | 2,700 | 10 | rectangular |
| | 2-6 | 1,600 | 10 | rectangular |
| | 2-7 | 1,000 | 10 | rectangular |
| | 2-8 | 1,500 | 10 | rectangular |
| | 2-9 | 2,000 | 10 | rectangular |
| | 2-10 | 1,700 | 8 | rectangular |
| | 2-11 | 1,300 | 10 | rectangular |

TABLE 2-continued

| | | Optimum dose (mJ/cm$^2$) | Resolution (μm) | Pattern profile |
|---|---|---|---|---|
| Comparative Example | 2-1 | 1,800 | 30 | rectangular |
| | 2-2 | 1,600 | 20 | rectangular |
| | 2-3 | 1,600 | 20 | rectangular |
| | 2-4 | 2,000 | 30 | inversely tapered |
| | 2-5 | 1,500 | 30 | rectangular |

[4] Preparation of Photosensitive Dry Film and Evaluation

Example 3

In a clean room at a cleanness class of 1,000, humidity 40-45%, and temperature 22-26° C., photosensitive resin composition 7 was coated onto a PET film of 38 μm thick as support film, by means of a die coater as the film coater. The coated film was passed through a hot air circulating oven (length 4 m) set at 100° C. over 5 minutes to form a photosensitive resin coating (100 μm thick) on the support film, yielding a photosensitive dry film. A PE film of 50 μm thick as the protective film was bonded to the surface of the photosensitive resin coating under a pressure of 1 MPa, yielding a protective film-bearing photosensitive dry film.

From the protective film-bearing photosensitive dry film, the protective film was stripped off. Using a vacuum laminator TEAM-100M (Takatori Corp.) with a vacuum chamber set at a vacuum of 80 Pa, the photosensitive resin coating on the support film was closely bonded to a copper substrate of 200 mm at a temperature of 60° C. After restoration of atmospheric pressure, the substrate was taken out of the laminator, and the support film was stripped off. This procedure was repeated three times to form three layers of photosensitive resin coating.

Then the photosensitive resin coating/substrate was prebaked on a hot plate at 110° C. for 5 minutes. The thickness of the photosensitive resin coating as prebaked was measured by a contact type film thickness gauge (Mitsutoyo Co., Ltd.), finding a thickness of 300 μm. Using an i-line stepper (NSR-2205i11D by Nikon Corp.), the photosensitive resin coating was exposed to i-line through a reticle. The resin coating was PEB at 100° C. for 2 minutes, puddle developed in PGMEA for 45 minutes, rinsed with deionized water, and dried, forming a pattern.

The pattern was observed under SEM S-4700, finding that a hole pattern of 20 μm size was resolved rectangular at an exposure dose of 1,200 mJ/cm$^2$.

Japanese Patent Application No. 2018-237135 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising
   (A) a polymer comprising repeating units having the formula (A1) and repeating units of at least one type selected from repeating units having the formula (A2) and repeating units having the formula (A3), shown below,
   (B) a phenol compound having a weight average molecular weight of 300 to 10,000,
   (C) a photoacid generator,
   (D) a benzotriazole compound and/or imidazole compound, and
   (E) an organic solvent,

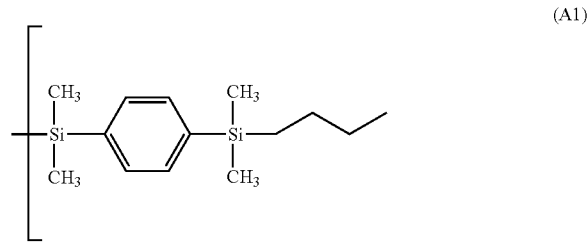

(A1)

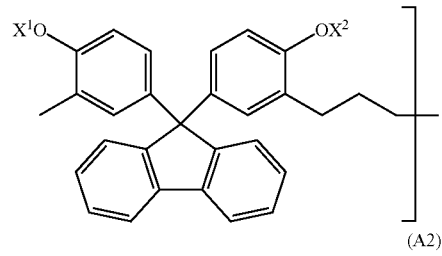

(A2)

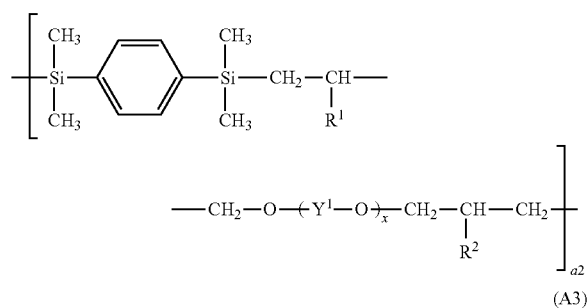

(A3)

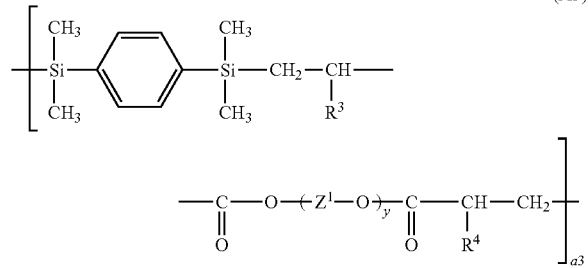

wherein $X^1$ and $X^2$ are each independently hydrogen or glycidyl group, $Y^1$ is a $C_1$-$C_5$ straight or branched alkanediyl group, $Z^1$ is a $C_1$-$C_{10}$ straight alkanediyl group which may contain hydroxyl, a $C_2$-$C_{10}$ branched alkanediyl group, or a divalent group having the formula (A4):

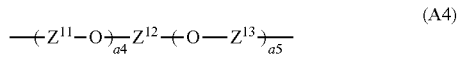

(A4)

wherein $Z^{11}$ and $Z^{13}$ are each independently a $C_1$-$C_5$ straight or branched alkanediyl group, $Z^{12}$ is a $C_1$-$C_{30}$ divalent hydrocarbon group, $a^4$ and $a^5$ are each independently an integer of 1 to 50, $R^1$, $R^2$, $R^3$ and $R^4$ are each independently hydrogen or a $C_1$-$C_{10}$ monovalent hydrocarbon group, $a^1$, $a^2$ and $a^3$ are numbers in the range: $0<a^1<1$, $0\leq a^2 <1, 0 \leq a^3 <1$, and $a^1+a^2+a^3=1$, x and y are each independently an integer of 1 to 50.

2. A photosensitive resin coating obtained from the photosensitive resin composition of claim 1.

3. A photosensitive dry film comprising a support film and the photosensitive resin coating of claim 2 thereon.

4. A pattern forming process comprising the steps of:
   (a) applying the photosensitive resin composition of claim 1 onto a substrate to form a photosensitive resin coating thereon,
   (b) exposing the photosensitive resin coating to radiation, and
   (c) developing the exposed resin coating in an organic solvent.

5. A pattern forming process comprising the steps of:
   (a') using the photosensitive dry film of claim 3 to form the photosensitive resin coating on a substrate,
   (b) exposing the photosensitive resin coating to radiation, and
   (c) developing the exposed resin coating in an organic solvent.

6. The photosensitive resin composition of claim 1 wherein the phenol compound having a weight average molecular weight of 300 to 10,000 is selected from a novolak resin, polyhydroxystyrene, bisphenols, trisphenols, polyphenols, and compounds having the following formulae (B1), (B2) and (B3):

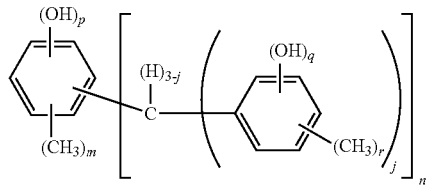
(B1)

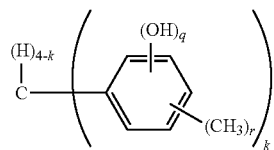
(B2)

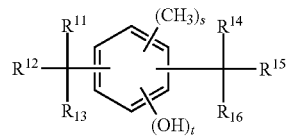
(B3)

wherein j is 1 or 2; m, p and r are each independently an integer of 0 to 3, q is an integer of 1 to 3, and n is an integer of 1 to 4, meeting $1 \leq m+n+p \leq 6$, and $1 \leq q+r \leq 5$, k is an integer of 2 or 3, q and r are as defined above, s and t are each independently an integer of 0 to 3, meeting $0 \leq s+t$ 4, $R^{11}$ to $R^{16}$ are each independently hydrogen, methyl, or a group having the formula (B4) below, with the proviso that at least one of $R^{11}$ to $R^{13}$ and at least one of $R^{14}$ to $R^{16}$ are a group having formula (B4) wherein u is an integer of 1 to 3,

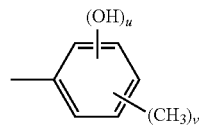
(B4)

wherein u and v are each independently an integer of 0 to 3, meeting $0 \leq u+v \leq 4$.

* * * * *